(12) United States Patent
Hsu

(10) Patent No.: US 7,287,879 B2
(45) Date of Patent: Oct. 30, 2007

(54) THERMAL MODULE AND BACKLIGHT SYSTEM USING THE SAME

(75) Inventor: Ming-Fu Hsu, Tu-cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 9 days.

(21) Appl. No.: 11/407,177

(22) Filed: Apr. 19, 2006

(65) Prior Publication Data

US 2007/0053165 A1    Mar. 8, 2007

(30) Foreign Application Priority Data

Sep. 2, 2005    (CN) .................... 2005 1 0037023

(51) Int. Cl.
*F21V 29/00* (2006.01)
(52) U.S. Cl. ..................... 362/294; 361/704
(58) Field of Classification Search ............ 362/294; 361/704

See application file for complete search history.

(56) References Cited

U.S. PATENT DOCUMENTS

| | | | |
|---|---|---|---|
| 4,561,011 A * | 12/1985 | Kohara et al. | 257/713 |
| 5,305,185 A * | 4/1994 | Samarov et al. | 361/704 |
| 5,548,481 A * | 8/1996 | Salisbury et al. | 361/709 |
| 6,281,573 B1 * | 8/2001 | Atwood et al. | 257/706 |
| 6,727,193 B2 * | 4/2004 | Gektin et al. | 438/795 |
| 6,752,204 B2 * | 6/2004 | Dishongh et al. | 165/185 |
| 6,982,877 B2 * | 1/2006 | Vinson et al. | 361/719 |
| 7,098,080 B2 * | 8/2006 | Takeuchi | 438/122 |
| 7,205,719 B2 * | 4/2007 | Tain et al. | 313/512 |
| 2004/0042178 A1 * | 3/2004 | Gektin et al. | 361/705 |
| 2004/0222516 A1 * | 11/2004 | Lin et al. | 257/712 |
| 2006/0098441 A1 * | 5/2006 | Chou | 362/294 |
| 2007/0008275 A1 * | 1/2007 | Sugitani et al. | 345/102 |

* cited by examiner

*Primary Examiner*—Hargobind S. Sawhney
(74) *Attorney, Agent, or Firm*—Morris Manning Martin LLP; Tim Tingkang Xia, Esq.

(57) ABSTRACT

A thermal module includes a plurality of heat dissipation units. Each of the heat dissipation units includes a main portion, a head portion, and a neck portion interconnecting the main portion and the head portion. Each main portion includes a base, a plurality of fins disposed on the base, a first latch and second latch respectively disposed on the two outermost fins. The first latch of the heat dissipation unit can be mounted into the second latch of the adjacent heat dissipation unit, and the second latch of the heat dissipation unit can be mounted into the first latch of the other adjacent heat dissipation unit, thereby the plurality of heat dissipation units are assembled. The size of the thermal module can be adjusted easily, and it is convenient to substitute the damaged light source module. This thermal module can be used in a backlight system.

17 Claims, 6 Drawing Sheets

THERMAL MODULE AND BACKLIGHT SYSTEM USING THE SAME

TECHNICAL FIELD

The present invention relates to a thermal module, and particularly, to a backlight system for use in, e.g., a liquid crystal display (LCD).

GENERAL BACKGROUND

In a liquid crystal display device, a liquid crystal is a substance that does not itself radiate light. Instead, the liquid crystal relies on light received from a light source, thereby displaying images and data. In the case of a typical liquid crystal display, a backlight system powered by electricity supplies the needed light.

Typically, there are two types of backlight systems: an edge lighting type and a bottom-lighting type. The edge-lighting type of backlight system is widely used in small and medium size liquid crystal display for merits on small weight, thin body and low energy cost. Large size liquid crystal display seldom uses the edge-lighting backlight system because the results based on the merits mentioned above is poor. Furthermore, the large size edge-lighting type backlight system seldom satisfies the requirement of light brightness and optical uniformity. Nowadays, the market demand for larger size liquid crystal display has increased progressively. Therefore, the bottom-lighting type of backlight system needs to be developed to satisfy the market demand.

A conventional bottom-lighting backlight system includes a thermal module and a light source module. The light source module includes an electronic circuit board and a plurality of light emitting diodes electrically connected to the electric circuit board. The thermal module is generally a flat sheet, which includes a heat conductive surface and a heat dissipating face defined on the opposite surface. The light source module is disposed on the heat conductive surface of the thermal module.

However, adjusting the size of the thermal module of the backlight system cannot be done easily. In addition, because the light source module is fixed to the thermal module, the entire thermal module needs to be disassembled whenever any light emitting diodes on the light source module is damaged. Disassembling the thermal module is very troublesome and also increases the risk of damaging other working elements of the liquid display device.

What is needed, therefore, is a thermal module and a backlight system using the same that overcomes the above mentioned disadvantages.

SUMMARY

A thermal module according to a preferred embodiment includes a plurality of heat dissipation units. Each heat dissipation unit includes a main portion, a head portion, and a neck portion interconnecting the main portion and the head portion. Each main portion includes a base, a plurality of fins disposed on the base, a first latch, and second latch respectively disposed on the two outermost fins. The first latch of the heat dissipation unit can be mounted into the second latch of the adjacent heat dissipation unit, and the second latch of the heat dissipation unit can be mounted into the first latch of the other adjacent heat dissipation unit, thereby a plurality of heat dissipation units are assembled side by side in series.

A backlight system according to another preferred embodiment includes a plurality of light source modules and a thermal module receiving the light source modules. Each light source module includes a base board and a plurality of light sources fixed on the base board. The same thermal module as described in the previous paragraph is employed in this embodiment.

Other advantages and novel features will become more apparent from the following detailed description of preferred embodiments when taken in conjunction with the accompanying drawings.

BRIEF DESCRIPTION OF THE DRAWINGS

Many aspects of the thermal module and the backlight system having the same can be better understood with reference to the following drawings. The components in the drawings are not necessarily to scale, the emphasis instead being placed upon clearly illustrating the principles of the present thermal module and the related backlight system. Moreover, in the drawings, like reference numerals designate corresponding parts throughout the several views.

DETAILED DESCRIPTION OF THE PREFERRED EMBODIMENTS

Reference will now be made to the drawings to describe preferred embodiments of the present thermal module and the related backlight system in detail.

Figure 1:
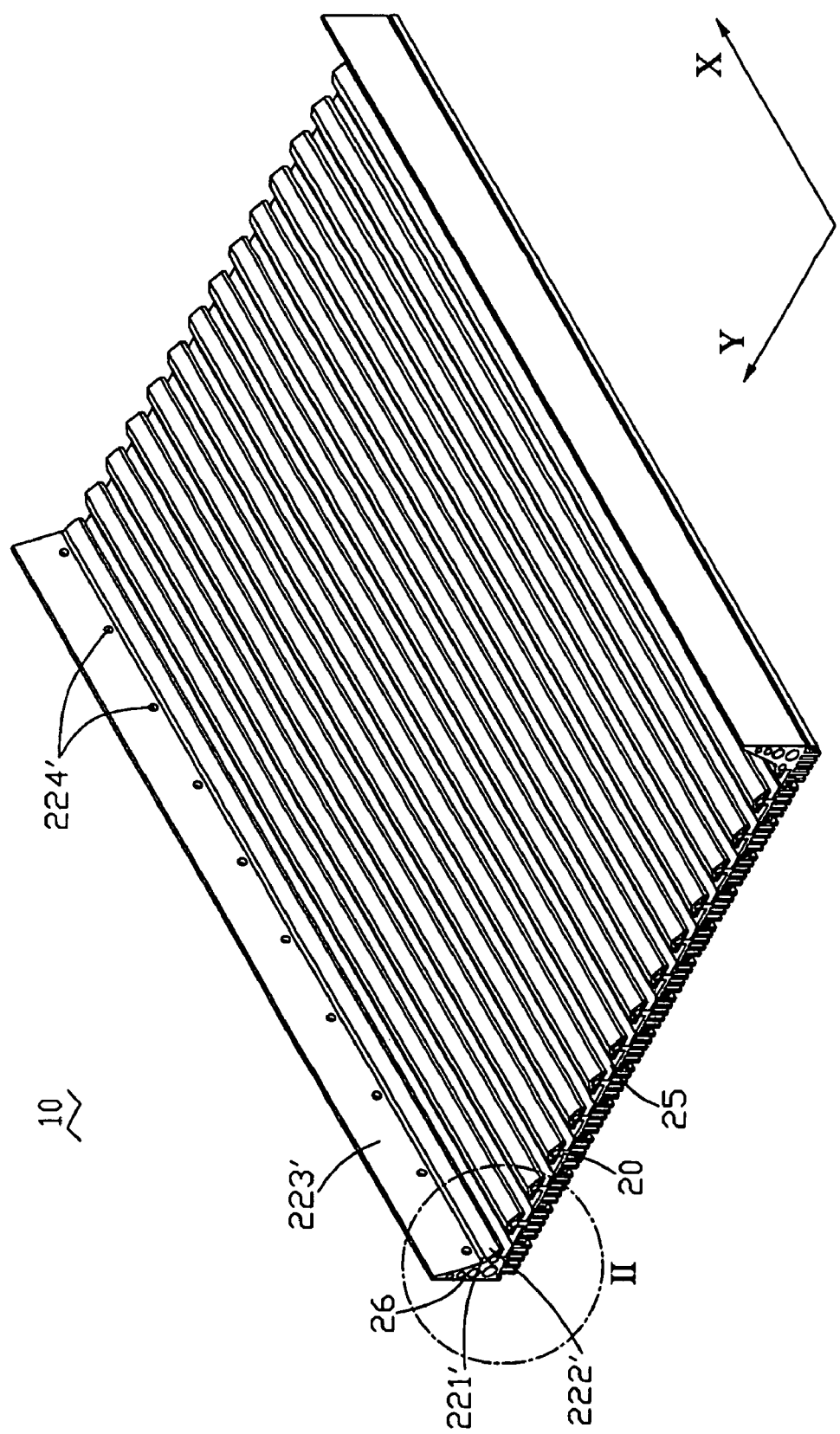
FIG. 1 is a schematic, perspective view of a thermal module according to a first preferred embodiment.
Figure 2:
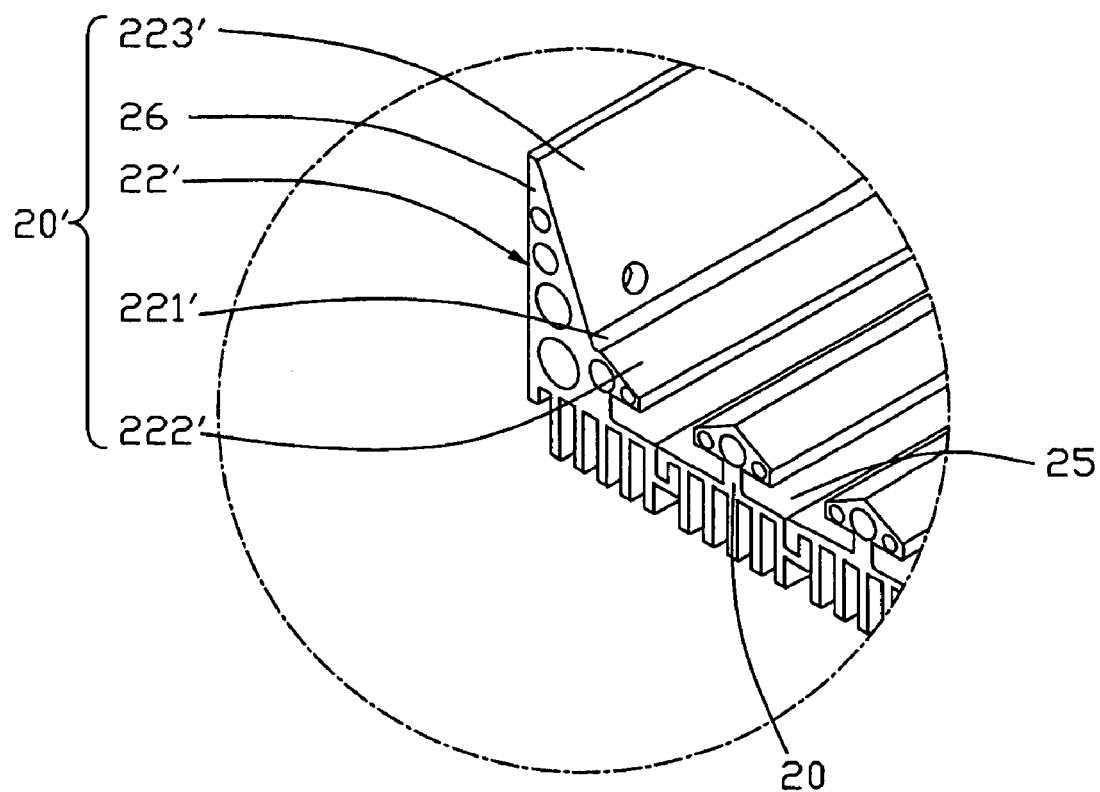
FIG. 2 is an enlarged view of a circled portion II of FIG. 1.
Figure 3:
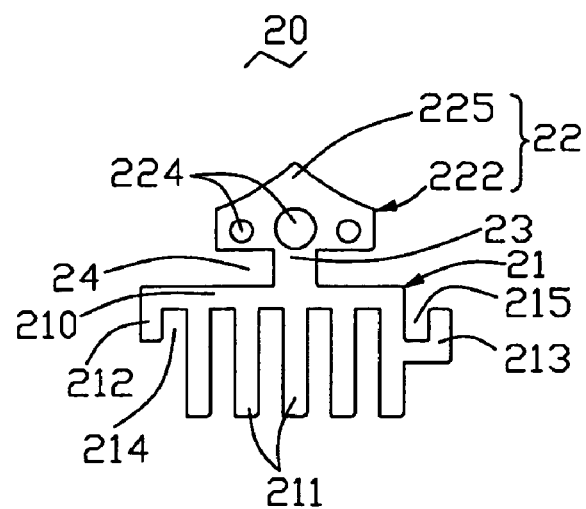
FIG. 3 is a left side view of a heat dissipation unit of the thermal module of FIG. 1.
Figure 4:
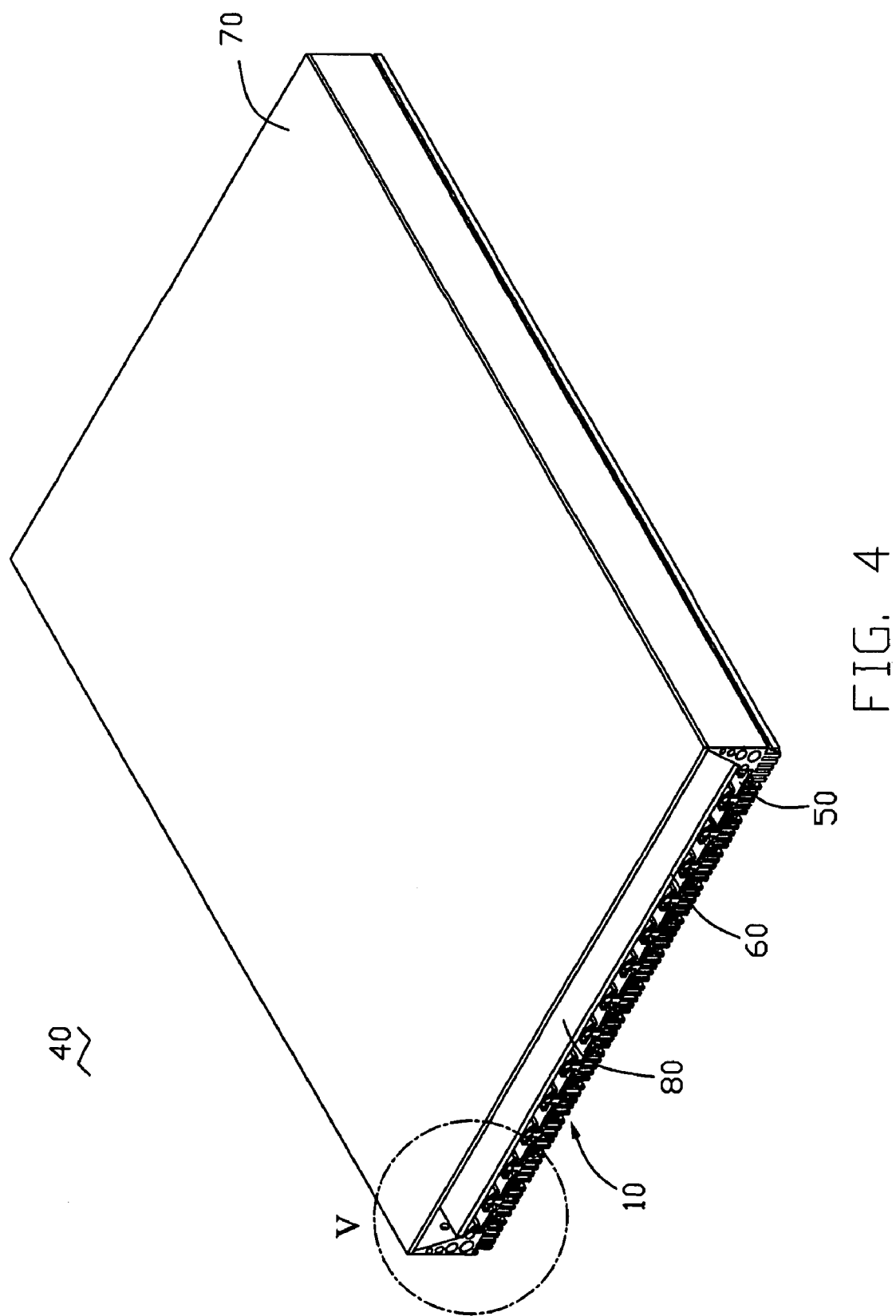
FIG. 4 is a schematic, perspective view of a backlight system according to a second preferred embodiment.
Figure 5:
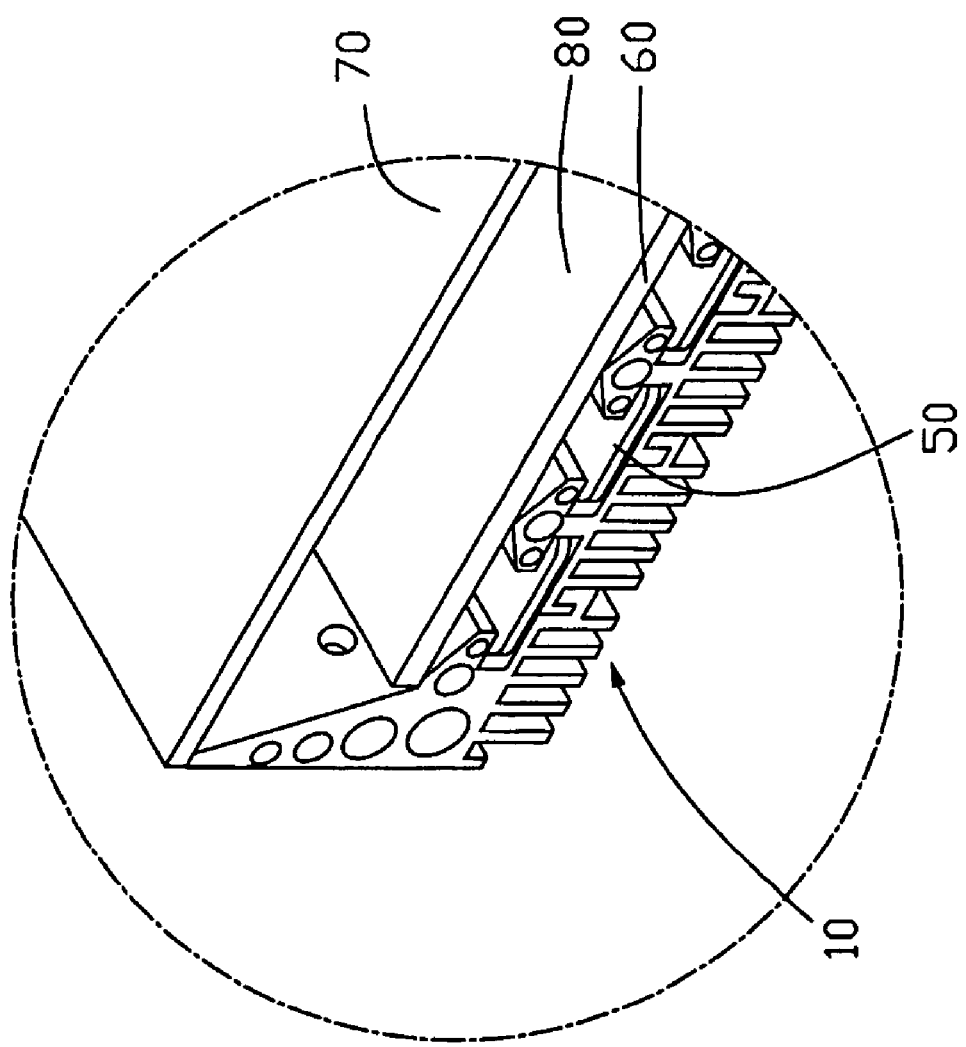
FIG. 5 is an enlarged view of a circled portion V of FIG. 4.
Figure 6:
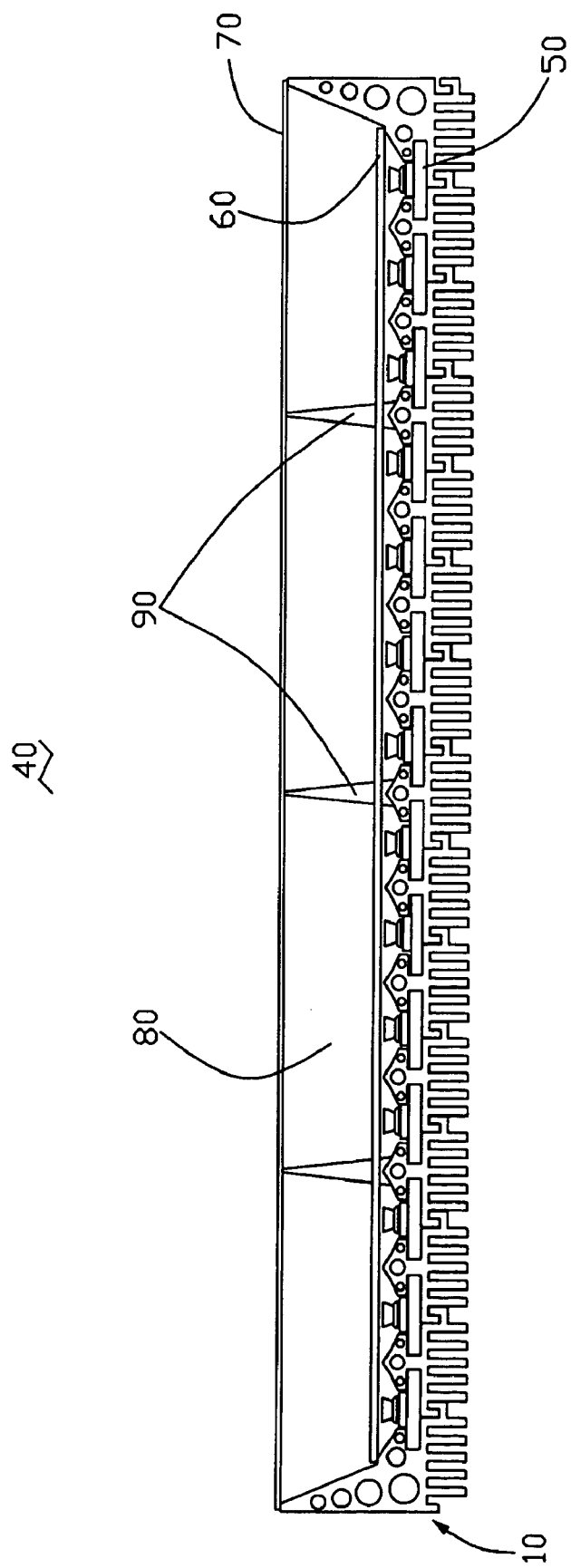
FIG. 6 is a left side view of the backlight system of FIG. 4.
Figure 7:
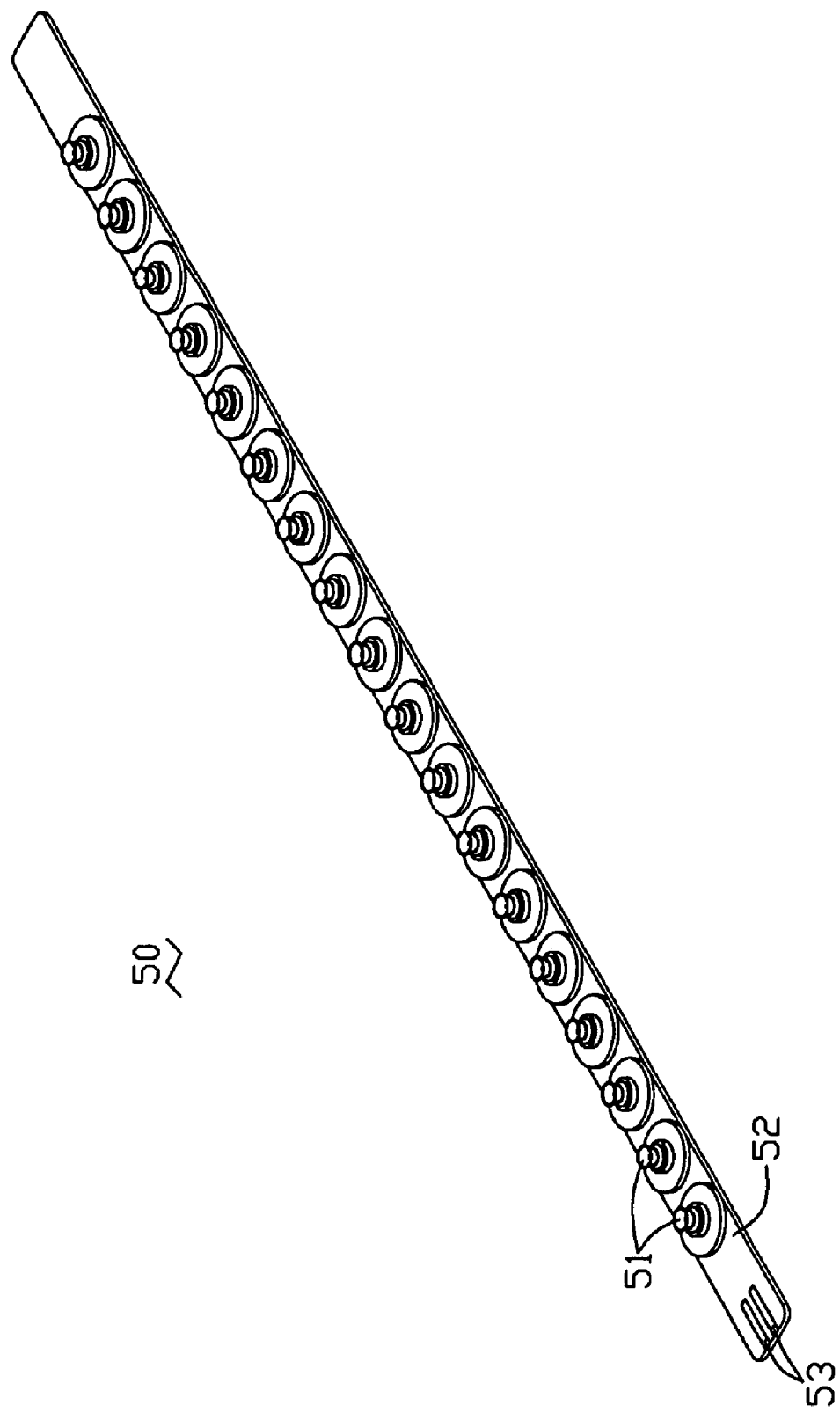
FIG. 7 is a schematic, perspective view of a light source module of the backlight system of FIG. 4.

Referring to FIGS. 1 through 3, a thermal module 10 in accordance with a first embodiment is shown. The thermal module 10 includes a plurality of heat dissipation units 20. Each heat dissipation unit 20 includes a main portion 21, a head portion 22, and a neck portion 23. The neck portion 23 interconnects the head portion 21 and the main portion 22.

The main portion 21 includes a base 210, a plurality of fins 211 forming a continuous heat dissipating surface thereon, a first latch 212, and a second latch 213. The base 210 is generally an elongated flat rod. Fins 211 with length the size of base 210 are disposed along a surface of the base 210 facing away from the head portion 22. The first latch 212 and the second latch 213 are respectively disposed on two outermost fins 211 of the main portion 21. The first latch 212 extends out from the base 210 of the outermost fin 211 of the main portion 21 and bends perpendicularly outward from the head portion 22. A first latching groove 214 is defined along the length of the base 210 between the end of first latch 212 and the adjacent outermost fin 211. The second latch 213 extends out from a middle portion of the opposite outermost fin 211 and bends toward the base 210. A second latching groove 215 is defined along the length of the base 210 between the end of second latch 213 and the adjacent outer-most fin 211.

When assembling the thermal module 10, the second latch 213 of the heat dissipation unit 20 can be engaged in the first latching groove 214 of the adjacent second heat dissipation unit 20, thereby a plurality of heat dissipation units 20 can be assembled together in series, side-by-side, to form the thermal module 10. As a result, adjusting the size of the thermal module 10 can be done easily and conveniently by assembling or disassembling a number of heat dissipation units 20 of the thermal module 10. In alternative embodiments, positions of the first latch 212 and the second latch 213 are interchangeable.

The head portion 22 is generally an elongated flat rod, which includes a light reflective surface 222 facing away from the neck portion 23. A plurality of through holes 224 is disposed in the body of the head portion 22 along the X-direction for improving heat dissipation capability. In the illustrated embodiment, the head portion 22 further includes a protrusion 225 disposed on the light reflective surface 222. This protrusion 225 defines a pair of adjacent arcuate surfaces thereof, so as to improve optical uniformity.

The head portion 22 is disposed in parallel with the main portion 21. The head portion's 22 width is smaller than that of the main portion 21. The neck portion 23 is generally an elongated rod that interconnects the main portion 21 and the head portion 22. Also referring to FIG. 3, two receiving grooves 24 are respectively defined on two sides of the neck portion 23 between the main portion 21 and the head portion 22. Also referring to FIG. 2, when a plurality of heat dissipation units 20 has been assembled together, a plurality of inverted T-shaped grooves 25 are defined between every opposing head portions 22 of adjacent heat dissipation units 20.

In order to support and accommodate optical elements, the outermost heat dissipation unit 20' of the thermal module 10 is configured to be the same as the inner heat dissipation unit 20, except that each outermost heat dissipation unit 20' further includes a sidewall 26 and a plurality of through holes 224 on the side wall 26'. The sidewall 26 is disposed on the outermost side of the head portion 22'. The through holes 224' are regularly arranged in a second reflecting surfaces 223' of the two sidewalls 26 along the X-direction. The head portion 22' includes a first reflecting surface 222' and a step surface 221' connecting the first reflecting surface 222'. The sidewall 26 has a second reflecting surface 223' connecting the step surface 221'. A height of the head portion 22' of the two outermost heat dissipation units 20' is higher than that of any other heat dissipation units 20.

The chemical composition of the heat dissipation unit 20 may include a combination of various metals such as aluminum, copper, and may also include engineering plastics that have good heat dissipation properties. If engineering plastics is used, it can be integrated with the heat dissipation unit during production by using extrusion molding methodology.

Referring to FIGS. 4 through 7, a backlight system 40, in accordance with a second embodiment is shown. The backlight system 40 includes a thermal module 20, a plurality of light source modules 50, a diffusing plate 60, and a brightness enhancement film 70. Each light source module 50 includes a print circuit board 52, and a plurality of light emitting diodes 51 electrically fixed on the print circuit board 52. The print circuit board 52 has several down-leads 53 disposed at one end thereof for electrically connecting to an external drive circuitry (not shown).

Each light source module 50 can be inserted into one inverted T-shaped grooves 25 of the thermal module 20. The printed circuit boards 52 are placed in contact with the main portions 21 of the thermal module 20 such that the light emitting diodes 51 are aligned in between two adjacent head portions 22 of the thermal module 20. Any light source modules 50 having damaged light emitting diodes 51 can be easily replaced by being drawn out from the thermal module. Thus disassembling the whole thermal module is also avoided.

The diffusing plate 60 is positioned on the step surface 221' of the two outermost heat dissipation units 20'. The brightness enhancement film 70 is positioned at the top of the sidewall 23' of the two outermost heat dissipation units 20'. A chamber 80 is thus formed between the diffusing plate 60 and the brightness enhancement film 70. When the backlight system 40 is in use, a significant amount of heat energy produced by the light emitted from the light emitting diodes 51 gathers in the chamber 80. This heat energy causes thermal deformation and defection in the diffusing plate 60 and the brightness enhancement film 70. In order to solve the above problem, through holes 224' are regularly arranged in the second reflecting surfaces 223' of the two sidewalls 26 along the X-direction, so as to improve the heat dissipation capability.

The two sidewalls 26 of heat dissipation unit 20 may not be enough to prevent the light enhancement film 70 from collapsing due to gravity, thus, the backlight system 40 may further includes a plurality of spacers 90 disposed on the head portions 22 of the heat dissipation unit 20 that passes through the diffusing plate 60 for supporting the light enhancement film 70.

It is to be understood that the backlight system 40 may further consists a thermal interface material layer (not shown) sandwiched between the print circuit board 52 of the light source module 50 and the main portions 21 of heat dissipation units 20, so as to improve the heat dissipation capability of the whole backlight system 40. Materials used for the thermal interface may consist of silica gel, carbon fiber reinforced composites, and so on.

It is to be understood that the backlight system may further includes other optical elements such as a polarized sheet positioned on the light enhancement film 70.

While the present invention has been described with reference to particular embodiments, the description is illustrative of the invention and is not to be construed as limiting the invention. Various modifications may be made to the embodiment by those skilled in the art without departing from the true spirit and scope of the invention as defined by the appended claims.

What is claimed is:

1. A thermal module, comprising:
    a plurality of heat dissipation units including:
        a main portion having a base, a plurality of fins disposed on the base, a first latch and a second latch respectively disposed at two outermost fins;
        a head portion; and
        a neck portion interconnecting the base of the main portion and the head portion;
        wherein one of the first and second latch extends out from the base of the outermost fin of the main portion, and bends perpendicularly outward from the head portion, and the other one of the first and second latch extends out from a middle portion of the opposite outermost fin and bends inwards to the base of the main portion.

2. The thermal module according to claim 1, wherein each heat dissipation unit has two receiving grooves defined at two sides of the neck portion between the main portion and the head portion, thereby a plurality of inverted T-shaped grooves are also defined between every opposing head portions of adjacent heat dissipation units.

3. The thermal module according to claim 1, wherein the head portion has a reflective surface located at the top thereof.

4. The thermal module according to claim 3, wherein the reflective surface has a pair of opposite arcuate surfaces.

5. The thermal module according to claim 1, wherein the head portion has a plurality of through holes defined therein.

6. The thermal module according to claim 1, wherein each outermost heat dissipation unit further includes a sidewall disposed on one side of the head portion thereof, and a plurality of through holes regularly arranged in the sidewall along a direction parallel to the head portion.

7. The thermal module according to claim 6, wherein the head portion includes a first reflecting surface and a step surface connecting the first reflecting surface, and the sidewall includes a second reflecting surface connecting the step surface.

8. The thermal module according to claim 6, wherein a height of the sidewall is higher than that of the head portion of the outermost heat dissipation unit.

9. A backlight system comprising:
   a plurality of light source modules having a base board and a plurality of light sources fixed on the base board;
   a thermal module receiving the light source modules, including:
      a plurality of heat dissipation units including:
         a main portion having a base, a plurality of fins disposed on the base, a first latch and a second latch respectively disposed at two outermost fins;
         a head portion; and
         a neck portion interconnecting the base of the main portion and the head portion;
         wherein one of the first and second latch extends out from the base of the outermost fin of the main portion, and bends perpendicularly outward from the head portion, and the other one of the first and second latch extends out from a middle portion of the opposite outermost fin and bends inwards to the base of the main portion.

10. The backlight system according to claim 9, wherein each heat dissipation unit has two receiving grooves defined at two sides of the neck portion between the main portion and the head portion, thereby a plurality of inverted T-shaped grooves are also defined between every opposing head portions of adjacent heat dissipation units, and each light source module is inserted into the inverted T-shaped groove respectively.

11. The backlight system according to claim 9, wherein the head portion has a reflective surface at the top thereof.

12. The backlight system according to claim 9, wherein the head portion has a plurality of through holes defined therein.

13. The backlight system according to claim 9, wherein each outermost heat dissipation unit further includes a sidewall disposed on one side of the head portion thereof, and a plurality of through holes regularly arranged in the sidewall along a direction parallel to the head portion.

14. The backlight system according to claim 13, wherein the head portion includes a first reflecting surface and a step surface connecting the first reflecting surface, and the sidewall includes a second reflecting surface connecting the step surface.

15. The backlight system according to claim 14, further comprising a diffusing plate positioned on the step surface of the outermost heat dissipation units.

16. The backlight system according to claim 15, further comprising a plurality of optical elements positioned at the top of the sidewalls of the outermost heat dissipation units, the optical elements is selected from the group comprising of a brightness enhancement film, a polarized sheet and a combination thereof.

17. A backlight system comprising:
   at least one light source module, performing as a heat generating source, installable in said backlight system; and
   a thermal module comprising at least one integrally-formed heat dissipation unit, said heat dissipation unit comprising a head portion extending toward said at least one light source module and forming a reflective surface around said at least one light source module so as to reflect light from said at least one light source module, and a main portion extending away from said at least one light source module to form a heat dissipating surface at a distal end thereof for heat dissipation, a groove definable between said head portion and said main portion enabling receiving of said at least one light source module therein beside said thermal module so as to establish a direct thermal transmissible path between said main portion of said thermal module and said at least one light source module
   wherein said at least one heat dissipation unit further comprising a latch extending aside from the main portion, and bending perpendicularly; the latch engagably matchable with a corresponding latch of a neighboring heat dissipation unit in order to commonly form said groove for receiving said at least one light source module between said at least one heat dissipation unit and said neighboring heat dissipation unit.

* * * * *